United States Patent
Lee

(10) Patent No.: US 8,816,726 B1
(45) Date of Patent: Aug. 26, 2014

(54) DIFFERENTIAL SIGNALING DRIVER

(71) Applicant: Via Technologies, Inc., New Taipei (TW)

(72) Inventor: Yeong-Sheng Lee, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 0 days.

(21) Appl. No.: 13/888,622

(22) Filed: May 7, 2013

(51) Int. Cl.
*H03K 3/00* (2006.01)
*H03K 17/16* (2006.01)

(52) U.S. Cl.
CPC .................................... *H03K 17/16* (2013.01)
USPC .......................................................... 327/108

(58) Field of Classification Search
None
See application file for complete search history.

(56) References Cited

U.S. PATENT DOCUMENTS

| | | | | |
|---|---|---|---|---|
| 6,788,116 B1 * | 9/2004 | Cook et al. | ...................... | 327/108 |
| 7,068,077 B1 * | 6/2006 | Reinschmidt | .................... | 326/83 |
| 7,183,813 B2 * | 2/2007 | Kasanyal et al. | ................ | 327/65 |
| 7,256,626 B2 * | 8/2007 | Nguyen et al. | ................. | 327/112 |
| 7,358,780 B2 * | 4/2008 | Chou | ............................ | 327/112 |
| 7,579,874 B2 * | 8/2009 | Chen et al. | ....................... | 326/83 |
| 7,598,779 B1 * | 10/2009 | Wang et al. | ..................... | 327/108 |
| 7,924,056 B2 * | 4/2011 | Kumar et al. | .................... | 326/83 |
| 7,990,178 B2 * | 8/2011 | Liu et al. | .......................... | 326/83 |
| 8,008,944 B2 * | 8/2011 | Dixit et al. | ....................... | 326/30 |
| 2007/0103205 A1 * | 5/2007 | Whetsel | ......................... | 327/108 |
| 2008/0116943 A1 * | 5/2008 | Nair | ............................... | 327/108 |
| 2008/0129349 A1 * | 6/2008 | Yanbo et al. | ................... | 327/112 |
| 2009/0045852 A1 * | 2/2009 | Agarwal | ......................... | 327/108 |
| 2010/0231268 A1 * | 9/2010 | Kumar et al. | .................. | 327/108 |
| 2011/0210774 A1 * | 9/2011 | Behel | .............................. | 327/164 |
| 2012/0194224 A1 * | 8/2012 | Moon et al. | ...................... | 327/99 |
| 2013/0076404 A1 * | 3/2013 | Lee et al. | ....................... | 327/108 |
| 2013/0194005 A1 * | 8/2013 | Voutilainen et al. | ........... | 327/108 |

* cited by examiner

*Primary Examiner* — Lincoln Donovan
*Assistant Examiner* — Khareem E Almo
(74) *Attorney, Agent, or Firm* — McClure, Qualey & Rodack, LLP

(57) ABSTRACT

A differential signaling driver includes a current source, a differential signal generator, and a resistor. The current source is connected between an operation voltage and a first node, and supplies a driving current to the first node. The differential signal generator is connected between the first node and a second node. The differential signal generator receives a digital input signal, and generates a pair of differential output signals at a first output node and a second output node according to the digital input signal. The resistor is connected between the second node and a ground voltage. The differential signal generator couples the first output node to the operation voltage and the second output node to the ground voltage or couples the first output node to the ground voltage and the second output node to the operation voltage according to the digital input signal.

10 Claims, 6 Drawing Sheets

DIFFERENTIAL SIGNALING DRIVER

BACKGROUND OF THE INVENTION

1. Field of the Invention

The disclosure generally relates to a differential signaling driver, and more particularly, relates to a differential signaling driver for generating stable and accurate differential output signals.

2. Description of the Related Art

Differential signaling circuits are very popular and used in data transmission nowadays, including LVDS (Low Voltage Differential Signaling), HDMI (High-Definition Multimedia Interface), and USB (Universal Serial Bus), etc. Differential signaling circuits have power saving and noise rejection advantages. However, differential signaling circuits often have common mode noise problems. Since a common mode node between differential output nodes of a differential signaling circuit is usually floating, a common mode voltage of the differential signaling circuit may be a random voltage and lead to inaccurate output signals. In addition, the common mode voltage and the differential output voltages cannot be independently adjusted.

In some prior art, a common mode feedback loop is incorporated into the differential signaling circuit to control the common mode voltage. The drawback of the prior design is that the common mode feedback loop further causes either instability or low operation speed of the differential signaling circuit. Accordingly, there is a need to design a novel differential signaling circuit to solve all of the foregoing problems.

BRIEF SUMMARY OF THE INVENTION

In a preferred embodiment, the invention is directed to a differential signaling driver, comprising: a current source, connected between an operation voltage and a first node, and supplying a driving current to the first node; a differential signal generator, connected between the first node and a second node, receiving a digital input signal, and generating a pair of differential output signals at a first output node and a second output node according to the digital input signal; and a first resistor, connected between the second node and a ground voltage, wherein the differential signal generator couples the first output node to the operation voltage and the second output node to the ground voltage or couples the first output node to the ground voltage and the second output node to the operation voltage according to the digital input signal.

In some embodiments, the differential signal generator comprises: a first switch, coupled between the first node and the first output node; and a fourth switch, coupled between the second output node and the second node, wherein the first and fourth switches are selectively closed and opened according to the digital input signal.

In some embodiments, the differential signal generator comprises: a second switch, coupled between the first node and the second output node; and a third switch, coupled between the first output node and the second node, wherein the second and third switches are selectively closed and opened according to the digital input signal.

In some embodiments, the differential signal generator comprises: a second resistor, coupled between the first output node and a third node; and a third resistor, coupled between the third node and the second output node.

In some embodiments, any of the first resistor, the second resistor, and the third resistor is implemented with an RTN (Resistor Tuning Network) element which comprises: a plurality of tunable branches, coupled in parallel between a first terminal and a second terminal of the RTN element, wherein each of the tunable branches comprises a resistor and a transistor, and the transistors have control terminals for receiving a control signal.

In some embodiments, the control signal is inputted by a user.

In some embodiments, the RTN element further comprises: a comparator, comparing a voltage difference between the first terminal and the second terminal with a reference voltage difference, and generating a comparison signal according to the voltage difference between the first terminal and the second terminal, wherein the control signal is generated according to the comparison signal.

In another preferred embodiment, the invention is directed to a differential signaling driver, comprising: a first resistor, connected between an operation voltage and a first node; a differential signal generator, connected between the first node and a second node, receiving a digital input signal, and generating a pair of differential output signals at a first output node and a second output node according to the digital input signal; and a current source, connected between the second node and a ground node, and supplying a driving current to the ground voltage, wherein the differential signal generator couples the first output node to the operation voltage and the second output node to the ground voltage or couples the first output node to the ground voltage and the second output node to the operation voltage according to the digital input signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures thereof in the invention are described in detail as follows.

Figure 1:
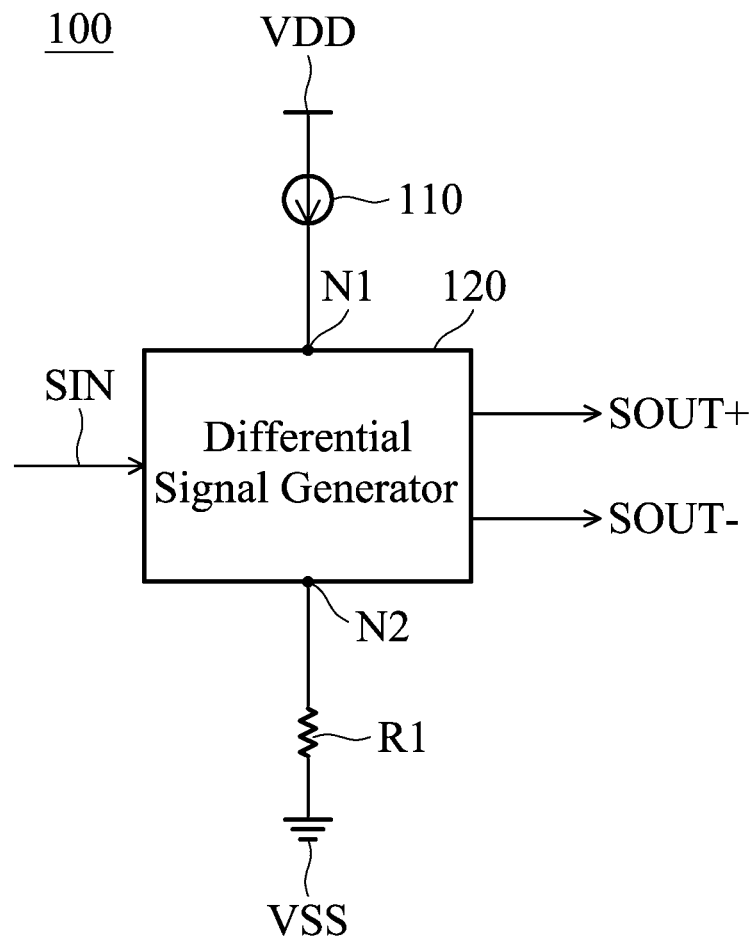
FIG. 1 is a diagram for illustrating a differential signaling driver according to an embodiment of the invention.

FIG. 1 is a diagram for illustrating a differential signaling driver 100 according to an embodiment of the invention. In a preferred embodiment, the differential signaling driver 100 can support the MIPI (Mobile Industry Processor Interface) specification, and may be applied to a mobile device, such as a smart phone, a tablet computer, or a notebook computer. The MIPI standard demands very low signal voltages, such as a common mode voltage of 0.2V while maintaining an output swing from 0.1V to 0.3V. As shown in FIG. 1, the differential signaling driver 100 comprises a current source 110, a differential signal generator 120, and a first resistor R1. The current source 110 supplies a driving current from an operation voltage VDD to a first node N1. The differential signal generator 120 is connected between the first node N1 and a second node N2. The differential signal generator 120 receives a digital input signal SIN, and generates a pair of differential output signals SOUT+ and SOUT− according to the digital input signal SIN. In some embodiments, the magnitude of the differential output signals SOUT+ and SOUT− is generally much smaller than that of the digital input signal SIN. The operation voltage VDD is approximately equal to 1V, a ground voltage VSS is approximately equal to 0V, the voltage level of the digital input signal SIN are approximately equal to either 1V or 0V, and any of the voltage levels of the differential output signals SOUT+ and SOUT− are approximately equal to either 300 mV or 100 mV. The first resistor R1 is connected between the second node N2 and the ground voltage VSS. Since the differential signal generator 120 is not floated and is coupled through the first resistor R1 to a constant voltage (e.g., the ground voltage VSS), a common mode voltage of the differential signaling driver 100 is well defined in the invention.

Figure 2:
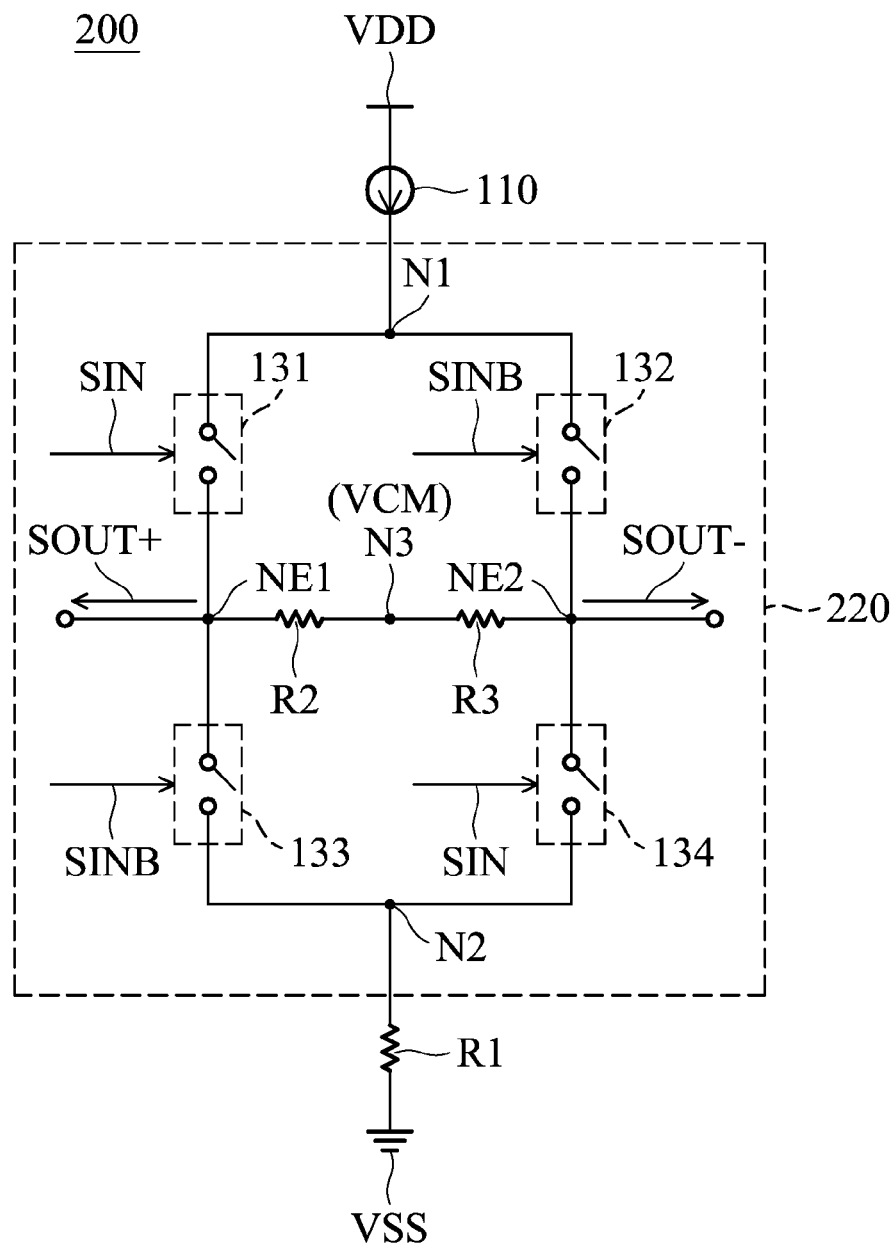
FIG. 2 is a diagram for illustrating a differential signaling driver according to a preferred embodiment of the invention.

FIG. 2 is a diagram for illustrating a differential signaling driver 200 according to a preferred embodiment of the invention. As shown in FIG. 2, a differential signal generator 220 of the differential signaling driver 200 comprises a first switch 131, a second switch 132, a third switch 133, a fourth switch 134, a second resistor R2, and a third resistor R3. In the embodiment, in addition to the digital input signal SIN, an inverted digital input signal SINB is further generated with an inverter (not shown) by inverting the digital input signal SIN. The first switch 131 is coupled between the first node N1 and a first output node NE1, and is selectively closed and opened according to the digital input signal SIN. The second switch 132 is coupled between the first node N1 and a second output node NE2, and is selectively closed and opened according to the inverted digital input signal SINB. The third switch 133 is coupled between the first output node NE1 and the second node N2, and is selectively closed and opened according to the inverted digital input signal SINB. The fourth switch 134 is coupled between the second output node NE2 and the second node N2, and is selectively closed and opened according to the digital input signal SIN. The second resistor R2 is coupled between the first output node NE1 and a third node N3. The third resistor R3 is coupled between the third node N3 and the second output node NE2. The first output node NE1 and the second output node NE2 are arranged to output the pair of differential output signals SOUT+ and SOUT−.

In some embodiments, the differential signaling driver 200 can be operated as follows. If the first switch 131 and the fourth switch 134 are closed according to the digital input signal SIN and the second switch 132 and the third switch 133 are opened according to the inverted digital input signal SINB, a first current path will be formed through the first switch 131, the second resistor R2, the third resistor R3, the fourth switch 134, and the first resistor R1. Therefore, the first output node NE1 is coupled to the operation voltage VDD and the second output node NE2 is coupled to the ground voltage VSS, and the difference between the differential output signals (SOUT+−SOUT−) is positive. Conversely, if the first switch 131 and the fourth switch 134 are opened according to the digital input signal SIN and the second switch 132 and the third switch 133 are closed according to the inverted digital input signal SINB, a second current path will be formed through the second switch 132, the third resistor R3, the second resistor R2, the third switch 133, and the first resistor R1. Therefore, the first output node NE1 is coupled to the ground voltage VSS and the second output node NE2 is coupled to the operation voltage VDD, and the difference between the differential output signals (SOUT+−SOUT−) is negative.

Note that in the above embodiments, since the third node N3 (common mode node) between the first output node NE1 and the second output node NE2 is substantially coupled through the first resistor R1 to a constant voltage (e.g., the ground voltage VSS), a common mode voltage VCM at the third node N3 is not floated and is arranged within a small range. Furthermore, no common mode feedback loop is incorporated in the invention. Accordingly, the differential signaling driver of the invention can reject common mode noise and generate the accurate differential output signals SOUT+ and SOUT− without decreasing the stability or the operation speed thereof. In addition, the common mode voltage VCM may be adjusted by tuning the resistance of the first resistor R1, and the voltage levels of the differential output signals SOUT+ and SOUT− may be adjusted by tuning the current provided by the current source 110. Therefore, the common mode voltage and the differential output signal voltages may be independently adjusted to conform to certain specifications such as the MIPI standards.

Figure 3:
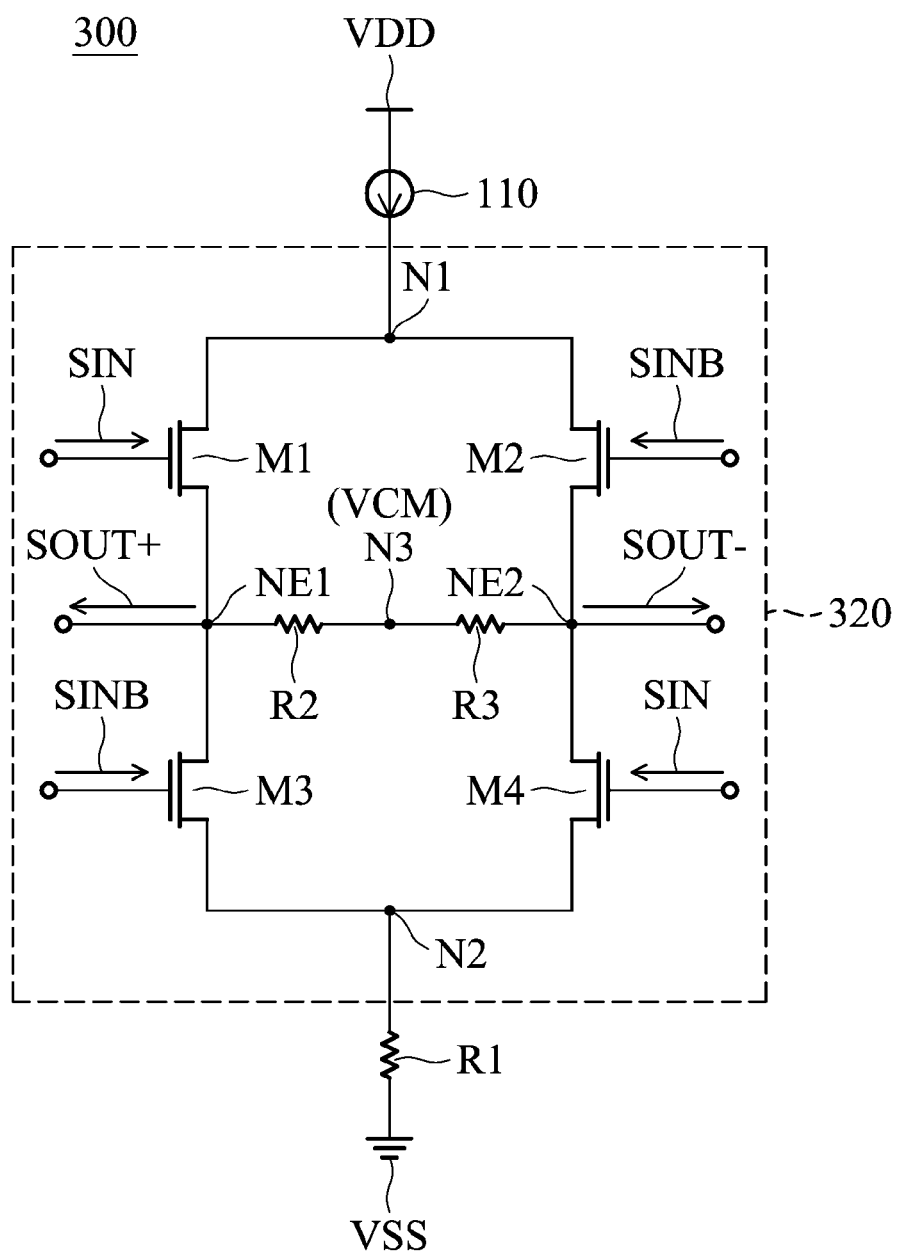
FIG. 3 is a diagram for illustrating a differential signaling driver according to an embodiment of the invention.

FIG. 3 is a diagram for illustrating a differential signaling driver 300 according to an embodiment of the invention. FIG. 3 is similar to FIG. 2. In the embodiment, the first switch 131, the second switch 132, the third switch 133, and the fourth switch 134 are implemented with four NMOS transistors (N-type Metal Oxide Semiconductor Field Effect Transistors) M1, M2, M3, and M4. Other features of the differential signaling driver 300 of FIG. 3 are similar to those of the differential signaling driver 200 of FIG. 2. Accordingly, the two embodiments can achieve similar performances. It is understood that the invention is not limited to the above. In some embodiments, the first switch 131, the second switch 132, the third switch 133, and the fourth switch 134 are implemented with four PMOS transistors (P-type Metal Oxide Semiconductor Field Effect Transistors). In some embodiments, the first switch 131 and the second switch 132 are implemented with PMOS transistors, and the third switch 133 and the fourth switch 134 are implemented with NMOS transistors. In this embodiment, the first switch 131 and the third switch 133 are selectively closed and opened according to the digital input signal SIN, and the second switch 132 and the fourth switch 134 are selectively closed and opened according to the inverted digital input signal SINB. In some embodiments, the first switch 131, the second switch 132, the third switch 133, and the fourth switch 134 are implemented with four BJTs (Bipolar Junction Transistors).

Figure 4:
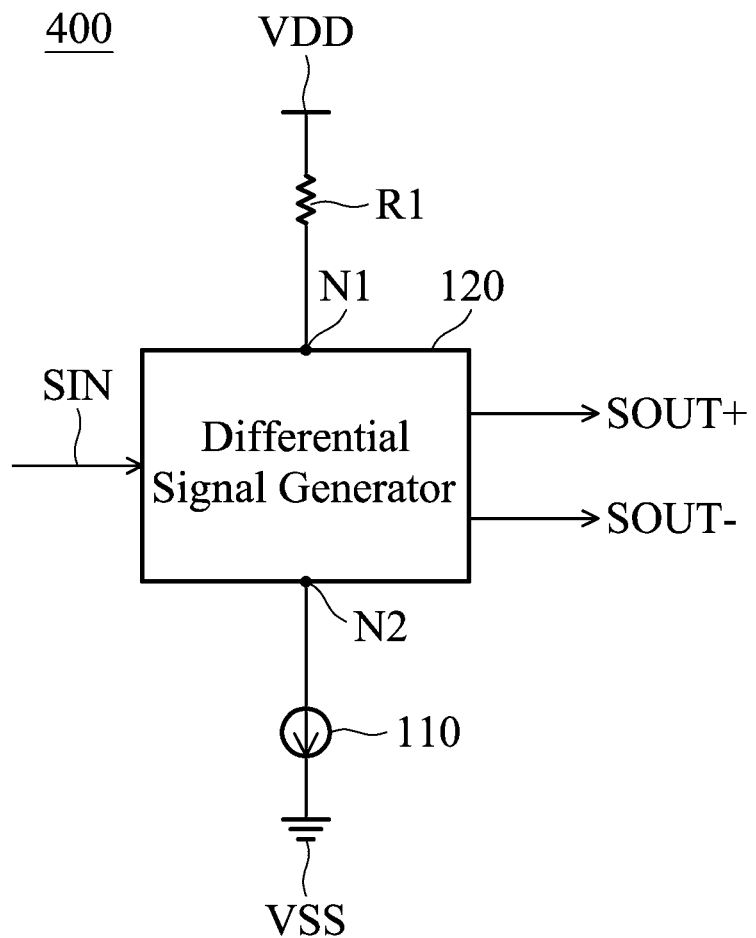
FIG. 4 is a diagram for illustrating a differential signaling driver according to an embodiment of the invention.

FIG. 4 is a diagram for illustrating a differential signaling driver 400 according to an embodiment of the invention. FIG. 4 is similar to FIG. 1. As shown in FIG. 4, the first resistor R1 is connected between the operation voltage VDD and the first node N1, and the current source 110 supplies a driving current from the second node N2 to the ground voltage VSS. In comparison to FIG. 1, the positions of the current source 110 and the first resistor R1 are interchanged in FIG. 4. The differential signal generator 120 may have configurations similar to FIG. 2 or FIG. 3. Since the differential signal generator 120 is still coupled through the first resistor R1 to a constant voltage (e.g., the operation voltage VDD), a common mode voltage of the differential signaling driver 400 is well defined. Thus, the differential output signals SOUT+ and SOUT− are accurate. In addition, the common mode voltage VCM and the voltage levels of the differential output signals SOUT+ and SOUT− may be independently adjusted as shown in FIG. 2 or FIG. 3. Other features of the differential signaling driver 400 of FIG. 4 are similar to those of the differential signaling driver 200 of FIG. 1 to FIG. 3. Accordingly, the two embodiments can achieve similar performances.

Figure 5A:
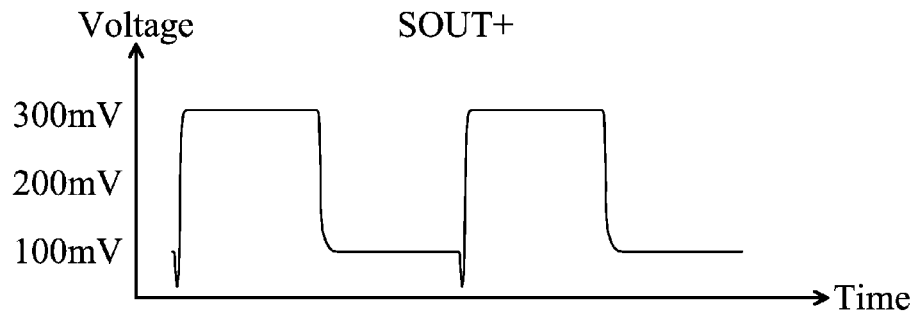
FIG. 5A is a diagram for illustrating a waveform of a differential output signal according to an embodiment of the invention.
Figure 5B:
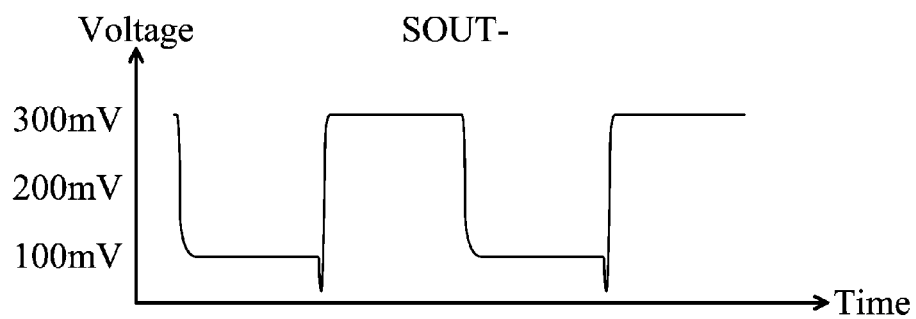
FIG. 5B is a diagram for illustrating a waveform of a differential output signal according to an embodiment of the invention.
Figure 5C:
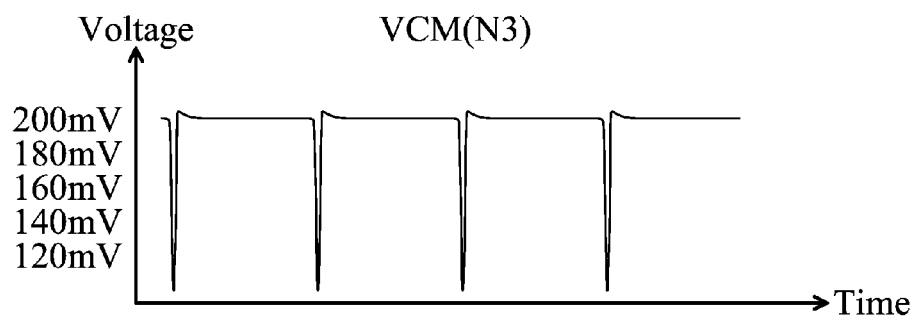
FIG. 5C is a diagram for illustrating a waveform of a common mode voltage according to an embodiment of the invention.

FIG. 5A is a diagram for illustrating a waveform of the differential output signal SOUT+ according to an embodiment of the invention. FIG. 5B is a diagram for illustrating a waveform of the differential output signal SOUT− according to an embodiment of the invention. FIG. 5C is a diagram for illustrating a waveform of the common mode voltage VCM at the third node N3 according to an embodiment of the invention. In FIGS. 5A-5C, the horizontal axis represents time, and the vertical axis represents magnitude of each signal. FIGS. 5A-5C show the measurement result of any differential signaling driver of the invention. As shown in FIGS. 5A-5C, the voltage levels of the differential output signals SOUT+ and SOUT− may be approximately equal to 100 mV or 300 mV, and the common mode voltage VCM may be approximately equal to 200 mV. Except for during transitions of the differential output signals SOUT+ and SOUT−, the common mode voltage VCM is almost a constant voltage biased to 200 mV and helps to improve the output accuracy of the differential signaling driver. Therefore, the differential signaling driver of the invention can generate the common mode voltage and the differential output signal voltages in accordance with the MIPI standards.

In some embodiments, the element parameters of each differential signaling driver of the invention are set as follows. The operation voltage VDD is approximately equal to 1V. The ground voltage VSS is approximately equal to 0V. Any of the voltage levels of the digital input signal SIN and the inverted digital input signal SINB are approximately equal to either 1V or 0V. The driving current of the current source 110 is approximately equal to 4 mA. A resistance of the first resistor R1 is approximately equal to 25Ω. A resistance of each of the second resistor R2 and the third resistor R3 is approximately equal to 50Ω.

Figure 6:
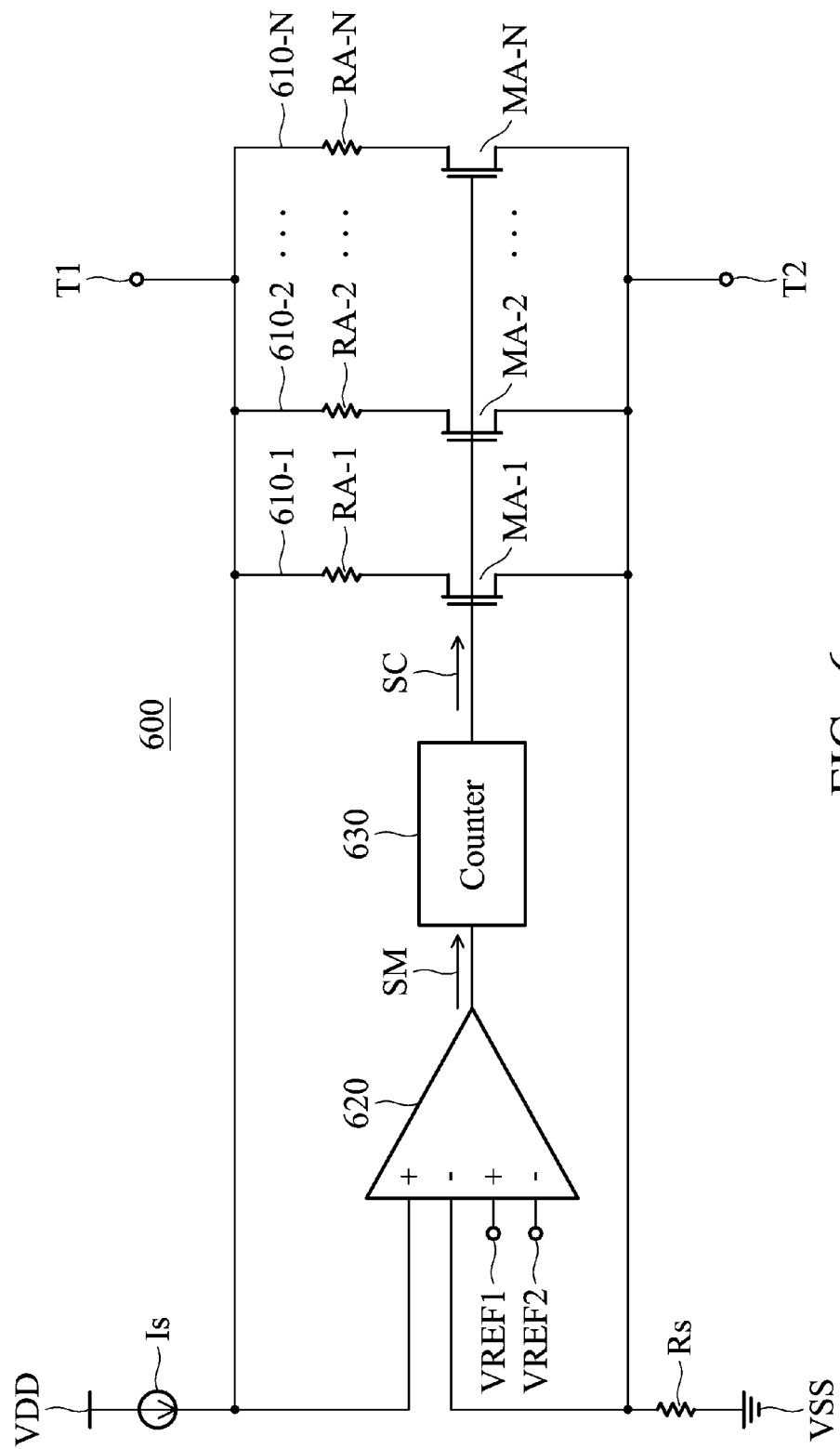
FIG. 6 is a diagram for illustrating an RTN (Resistor Tuning Network) element according to an embodiment of the invention.

FIG. 6 is a diagram for illustrating an RTN (Resistor Tuning Network) element 600 according to an embodiment of the invention. In order to provide an accurate resistance, any of the first resistor R1, the second resistor R2, and the third resistor R3 may be implemented with the RTN element 600 which serves as an equivalent resistor. As shown in FIG. 6, the RTN element 600 comprises a plurality of tunable branches 610-1, 610-2, . . . , and 610-N (N is a positive integer), a test current source Is and a test resistor Rs, a dual differential comparator 620, and a counter 630. A first terminal T1 and a second terminal T2 of the RTN element 600 are arranged as two terminals of the equivalent resistor. The tunable branches 610-1, 610-2, . . . , and 610-N are coupled in parallel between the first terminal T1 and the second terminal T2 of the RTN element 600. Each of the tunable branches 610-1, 610-2, . . . , and 610-N comprises a resistor and a switch (e.g., a transistor). For example, the tunable branch 610-1 comprises a resistor RA-1 and a transistor MA-1, and the tunable branch 610-2 comprises a resistor RA-2 and a transistor MA-2, and so on. In some embodiments, the resistors may be chosen to have resistance values that are binary multiples of each other. For example, the resistor RA-1 may have a resistance value of 64Ω, while the resistors RA-2 to RA-N may be fabricated to have scaled resistance values of 32Ω, 16Ω, . . . , and so on. In another embodiment, the resistors may have other designs of resistance values. The transistors MA-1, MA-2, . . . , and MA-N have control terminals for receiving a control signal SC. In some embodiments, the transistors MA-1, MA-2, . . . , and MA-N are implemented with NMOS transistors, PMOS transistors, or BJTs. The transistors MA-1, MA-2, . . . , and MA-N are selectively activated by the control signal SC coupled to the transistor gates as shown to provide for selective control over the resulting network resistance values. In this manner, a sizable resistance value is achieved between the first and second terminals T1 and T2, for example a resistance value incrementally ranging between 0.512Ω and 64Ω, depending on the value of the control signal SC. The dual differential comparator 620 has a first positive input terminal coupled to the first terminal T1 of the RTN element 600 and the test current source Is, a first negative input terminal coupled to the second terminal T2 of the RTN element 600 and the test resistor Rs, a second positive input terminal coupled to a first reference voltage VREF1, a second negative input terminal coupled to a second reference voltage VREF2, and an output terminal for outputting a comparison signal SM. The counter 630 is coupled to the output terminal of the dual differential comparator 620, and generates the control signal SC (e.g., the control signal SC comprises a plurality of digital control signals, such as <1:N>, for controlling the plurality of tunable branches 610-1, 610-2, . . . , and 610-N, wherein each bit of the control signal SC corresponds to controlling one of the transistors MA-1, MA-2, . . . , and MA-N according to the comparison signal SM. The test current source Is generates a current flowing to the first terminal T1. The current flows through the tunable branches 610-1, 610-2, . . . , and 610-N to generate a voltage difference between the first and second terminals T1 and T2 (and thus between the first positive input terminal and the first negative input terminal of the dual differential comparator 620). The voltage difference between the first and second terminals T1 and T2 is equal to the current from the test current source Is multiplied by the total resistance of the tunable branches 610-1, 610-2, . . . , and 610-N. The first reference voltage VREF1 and the second reference voltage VREF2 are appropriately designed such that their difference (VREF1−VREF2) is equal to the current from the test current source Is multiplied by the desired resistance between the first and second terminals T1 and T2. In some embodiments, the first reference voltage VREF1 and the second reference voltage VREF2 may be set at fixed values during the fabrication of the circuit. In other embodiments, the first reference voltage VREF1 and the second reference voltage VREF2 may be adjustable according to user preferences. The dual differential comparator 620 compares the voltage difference between the first positive input terminal and the first negative input terminal with the reference voltage difference between the second positive input terminal and the second negative input terminal. If the voltage difference between the first positive and negative input terminals is larger than the reference voltage difference between the second positive and negative input terminals (i.e., the total resistance of the tunable branches 610-1, 610-2, . . . , and 610-N between the first and second terminals T1 and T2 is larger than the desired resistance), the dual differential comparator 620 may output the comparison signal SM in logic "high" so that the counter 630 adjusts the control signal SC to decrease the total resistance of the tunable branches 610-1, 610-2, . . . , and 610-N. On the contrary, if the voltage difference between the first positive and negative input terminals is smaller than the reference voltage difference between the second positive and negative input terminals (i.e., the total resistance of the tunable branches 610-1, 610-2, . . . , and 610-N between the first and second terminals T1 and T2 is smaller than the desired resistance), the dual differential comparator 620 may output the comparison signal SM in logic "low" so that the counter 630 adjusts the control signal SC to increase the total resistance of the tunable branches 610-1, 610-2, ..., and 610-N. For example, it is assumed that the desired resistance of the RTN element 600 is equal to 50Ω. The first and second reference voltages VREF1 and VREF2 are set to provide a specific reference voltage difference corresponding to the desired resistance as described above. If a total resistance of the RTN element 600 is equal to 60Ω currently, the dual differential comparator 620 can determine that the total resistance is too high by comparing the voltage difference between the first and second terminals T1 and T2 with the reference voltage difference, and control the counter 630 to turn on more transistors of the tunable branches 610-1, 610-2, ..., and 610-N until the total resistance is decreased to accurate 50Ω. Conversely, if the total resistance of the RTN element 600 is too low currently, the dual differential comparator 620 can determine that and control the counter 630 to turn off more transistors of the tunable branches 610-1, 610-2, ..., and 610-N to increase the total resistance. In another embodiment, the RTN element 600 comprises only the tunable branches 610-1, 610-2, ..., and 610-N, and a user directly inputs the control signal SC to control the transistors MA-1, MA-2, ..., and MA-N. By selectively turning on and off the transistors MA-1, MA-2, ..., and MA-N, the total resistance of the RTN element 600 can be adjusted to any desired value precisely. The RTN element 600 may be applied to each differential signaling driver through FIGS. 1-4.

Note that the above signal voltages, currents, resistances, and other element parameters are not limitations of the invention. A designer can adjust these parameters according to different requirements.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A differential signaling driver, comprising:
a current source, connected between an operation voltage and a first node, and supplying a driving current to the first node;
a differential signal generator, connected between the first node and a second node, receiving a digital input signal, and generating a pair of differential output signals at a first output node and a second output node according to the digital input signal; and
a first resistor, connected between the second node and a ground voltage,
wherein the differential signal generator couples the first output node to the operation voltage and the second output node to the ground voltage or couples the first output node to the ground voltage and the second output node to the operation voltage according to the digital input signal;
wherein the first resistor is implemented with an RTN (Resistor Tuning Network) element comprising:
a plurality of tunable branches, coupled in parallel between a first terminal and a second terminal of the RTN element, wherein each of the tunable branches comprises a resistor and a transistor, and the transistors each have a control terminal to selectively activate the transistor; and
a comparator, comparing a reference voltage difference with a voltage difference between the first terminal and the second terminal, and outputting a comparison signal according to the reference voltage difference and the voltage difference between the first terminal and the second terminal, wherein the control terminals of the transistors of the plurality of tunable branches are coupled to the comparison signal.

2. The differential signaling driver as claimed in claim 1, wherein the differential signal generator comprises:
a first switch, coupled between the first node and the first output node; and
a fourth switch, coupled between the second output node and the second node,
wherein the first and fourth switches are selectively closed and opened according to the digital input signal.

3. The differential signaling driver as claimed in claim 1, wherein the differential signal generator comprises:
a second switch, coupled between the first node and the second output node; and
a third switch, coupled between the first output node and the second node,
wherein the second and third switches are selectively closed and opened according to the digital input signal.

4. The differential signaling driver as claimed in claim 1, wherein the differential signal generator comprises:
a second resistor, coupled between the first output node and a third node; and
a third resistor, coupled between the third node and the second output node.

5. The differential signaling driver as claimed in claim 1, wherein the control signal is inputted by a user.

6. A differential signaling driver, comprising:
a first resistor, connected between an operation voltage and a first node;
a differential signal generator, connected between the first node and a second node, receiving a digital input signal, and generating a pair of differential output signals at a first output node and a second output node according to the digital input signal; and
a current source, connected between the second node and a ground voltage, and sinking a driving current from the second node,
wherein the differential signal generator couples the first output node to the operation voltage and the second output node to the ground voltage or couples the first output node to the ground voltage and the second output node to the operation voltage according to the digital input signal;
wherein the first resistor is implemented with an RTN (Resistor Tuning Network) element comprising:
a plurality of tunable branches, coupled in parallel between a first terminal and a second terminal of the RTN element, wherein each of the tunable branches comprises a resistor and a transistor, and the transistors each have a control terminal to selectively activate the transistor; and
a comparator, comparing a reference voltage difference with a voltage difference between the first terminal and the second terminal, and outputting a comparison signal according to the reference voltage difference and the voltage difference between the first terminal and the second terminal, wherein the control terminals of the transistors of the plurality of tunable branches are coupled to the comparison signal.

7. The differential signaling driver as claimed in claim 6, wherein the differential signal generator comprises:
- a first switch, coupled between the first node and the first output node; and
- a fourth switch, coupled between the second output node and the second node,
- wherein the first and fourth switches are selectively closed and opened according to the digital input signal.

8. The differential signaling driver as claimed in claim 6, wherein the differential signal generator comprises:
- a second switch, coupled between the first node and the second output node; and
- a third switch, coupled between the first output node and the second node,
- wherein the second and third switches are selectively closed and opened according to the digital input signal.

9. The differential signaling driver as claimed in claim 6, wherein the differential signal generator comprises:
- a second resistor, coupled between the first output node and a third node; and
- a third resistor, coupled between the third node and the second output node.

10. The differential signaling driver as claimed in claim 6, wherein the control signal is inputted by a user.

* * * * *